US008902627B1

(12) United States Patent
Pesavento et al.

(10) Patent No.: US 8,902,627 B1
(45) Date of Patent: Dec. 2, 2014

(54) RFID IC WITH TUNNELING-VOLTAGE PROFILE CALIBRATION

(71) Applicant: Impinj, Inc., Seattle, WA (US)

(72) Inventors: Alberto Pesavento, Seattle, WA (US); Christopher J. Diorio, Shoreline, WA (US)

(73) Assignee: Impinj, Inc., Seattle, WA (US)

( * ) Notice: Subject to any disclaimer, the term of this patent is extended or adjusted under 35 U.S.C. 154(b) by 0 days.

(21) Appl. No.: 13/872,974

(22) Filed: Apr. 29, 2013

Related U.S. Application Data

(63) Continuation-in-part of application No. 13/033,863, filed on Feb. 24, 2011, now Pat. No. 8,451,673.

(51) Int. Cl.
*G11C 11/22* (2006.01)
*G11C 7/22* (2006.01)
*G06K 19/07* (2006.01)

(52) U.S. Cl.
CPC .............. *G11C 7/22* (2013.01); *G06K 19/0723* (2013.01)
USPC ............................ 365/145; 365/191; 365/192

(58) Field of Classification Search
USPC .......................................... 365/145, 191, 192
See application file for complete search history.

(56) References Cited

U.S. PATENT DOCUMENTS

| | | | | |
|---|---|---|---|---|
| 6,515,919 B1 * | 2/2003 | Lee | ............................... | 365/192 |
| 7,408,799 B2 * | 8/2008 | Kang | ............................ | 365/145 |
| 7,583,180 B2 * | 9/2009 | Sato | ........................... | 340/10.51 |
| 7,602,658 B2 * | 10/2009 | Kang et al. | .................... | 365/192 |
| 8,224,610 B2 * | 7/2012 | Diorio et al. | ................... | 702/107 |
| 8,451,673 B1 * | 5/2013 | Pesavento et al. | ............. | 365/191 |

* cited by examiner

*Primary Examiner* — Pho M Luu
(74) *Attorney, Agent, or Firm* — Turk IP Law, LLC (57) ABSTRACT

RFID tag ICs employ tunneling-voltage profile calibration during IC manufacturing to determine and store, typically in nonvolatile memory, a tunneling-voltage profile for writing data to the IC's nonvolatile memory. The IC may subsequently read the profile at power-up, prior to writing the memory, or at other times as determined by the IC or by an interrogating reader, and may determine an actual ramp profile for writing to the nonvolatile memory based on the read profile and one or more operating conditions. By using the read profile to determine an actual ramp profile for writing to the nonvolatile memory, the IC may reduce nonvolatile memory write time and oxide stress.

20 Claims, 10 Drawing Sheets

RFID IC WITH TUNNELING-VOLTAGE PROFILE CALIBRATION

CROSS REFERENCE TO RELATED APPLICATIONS

This application is a continuation-in-part of U.S. patent application Ser. No. 13/033,863 filed on Feb. 24, 2011, and also claims the benefit of U.S. Provisional Patent Application Ser. No. 61/310,146 filed on Mar. 3, 2010. The disclosures of these patent applications are hereby incorporated by reference for all purposes.

BACKGROUND

Radio-Frequency Identification (RFID) systems typically include RFID readers, also known as RFID reader/writers or RFID interrogators, and RFID tags. RFID systems can be used in many ways for locating and identifying objects to which the tags are attached. RFID systems are useful in product-related and service-related industries for tracking objects being processed, inventoried, or handled. In such cases, an RFID tag is usually attached to an individual item, or to its package.

In principle, RFID techniques entail using an RFID reader to interrogate one or more RFID tags. The reader transmitting a Radio Frequency (RF) wave performs the interrogation. The RF wave is typically electromagnetic, at least in the far field. The RF wave can also be predominantly electric or magnetic in the near field. The RF wave may encode one or more commands that instruct the tags to perform one or more actions.

A tag that senses the interrogating RF wave may respond by transmitting back another RF wave. The tag either generates the transmitted back RF wave originally, or by reflecting back a portion of the interrogating RF wave in a process known as backscatter. Backscatter may take place in a number of ways.

The reflected-back RF wave may encode data stored in the tag, such as a number. The response is demodulated and decoded by the reader, which thereby identifies, counts, or otherwise interacts with the associated item. The decoded data can denote a serial number, a price, a date, a destination, other attribute(s), any combination of attributes, and so on. Accordingly, when a reader receives tag data it can learn about the item that hosts the tag and/or about the tag itself.

An RFID tag typically includes an antenna section, a radio section, a power-management section, and frequently a logical section, a memory, or both. In some RFID tags the power-management section included an energy storage device such as a battery. RFID tags with an energy storage device are known as battery-assisted, semi-active, or active tags. Other RFID tags can be powered solely by the RF signal they receive. Such RFID tags do not include an energy storage device and are called passive tags. Of course, even passive tags typically include temporary energy- and data/flag-storage elements such as capacitors or inductors.

At least a portion of the memory is typically implemented as nonvolatile memory (NVM). An NVM comprises one or more memory cells, whose contents may be changed by a write operation. If the NVM employs floating-gate memory cells then the write operation often uses electron tunneling, where a high voltage applied across an oxide surrounding a floating gate induces electrons to tunnel onto or off of the floating gate. Because the physical characteristics of the memory cells may vary due to manufacturing tolerances, oxide thicknesses, etc., electron tunneling often employs a succession of voltage pulses of increasing amplitude, each of which is followed by a data-verification step. The pulses are stopped when the memory cell contains the proper value. This iterative write-verify process writes data to the NVM without prior knowledge of the required tunneling voltage and, at the same time, prevents over-tunneling because each new tunneling pulse ramps to only a slightly higher voltage then the prior pulse. Unfortunately, this approach typically wastes a substantial amount of time by slowly ramping the tunneling voltage from a safe, low value to the required value, where this required value may not be appreciably different from the first time that the memory cell was written.

BRIEF SUMMARY

This summary is provided to introduce a selection of concepts in a simplified form that are further described below in the Detailed Description. This summary is not intended to identify key features or essential features of the claimed subject matter, nor is it intended as an aid in determining the scope of the claimed subject matter.

Embodiments are directed to RFID ICs and methods of manufacturing RFID ICs employing tunneling-voltage profile calibration. The calibration determines and stores, typically in NVM, an optimum tunneling-voltage profile for writing data to the NVM. The IC may subsequently read the profile at power-up, prior to writing the NVM, or at other times as determined by the IC, and may then determine an actual ramp profile for writing to the NVM based on the read profile and one or more operating conditions. By using the read profile to determine an actual ramp profile for writing data to the NVM, the IC can reduce both NVM write time and oxide stress.

These and other features and advantages will be apparent from a reading of the following detailed description and a review of the associated drawings. It is to be understood that both the foregoing general description and the following detailed description are explanatory only and are not restrictive of aspects as claimed.

BRIEF DESCRIPTION OF THE DRAWINGS

The following Detailed Description proceeds with reference to the accompanying drawings, in which.

DETAILED DESCRIPTION

In the following detailed description, references are made to the accompanying drawings that form a part hereof, and in which are shown by way of illustration specific embodiments or examples. These embodiments or examples may be combined, other aspects may be utilized, and structural changes may be made without departing from the spirit or scope of the present disclosure. The following detailed description is therefore not to be taken in a limiting sense, and the scope of the present invention is defined by the appended claims and their equivalents.

As used herein, "memory" is one of ROM, RAM, SRAM, DRAM, NVM, EEPROM, FLASH, Fuse, MRAM, FRAM, and other similar information-storage technologies as will be known to those skilled in the art. Some portions of memory may be writeable and some not. "Command" refers to a reader request for one or more tags to perform one or more actions. "Protocol" refers to an industry standard for communications between a reader and a tag (and vice versa), such as the Class-1 Generation-2 UHF RFID Protocol for Communications at 860 MHz-960 MHz by EPCglobal, Inc. ("Gen2 Specification"), version 1.2.0 of which is hereby incorporated by reference.

Figure 1:
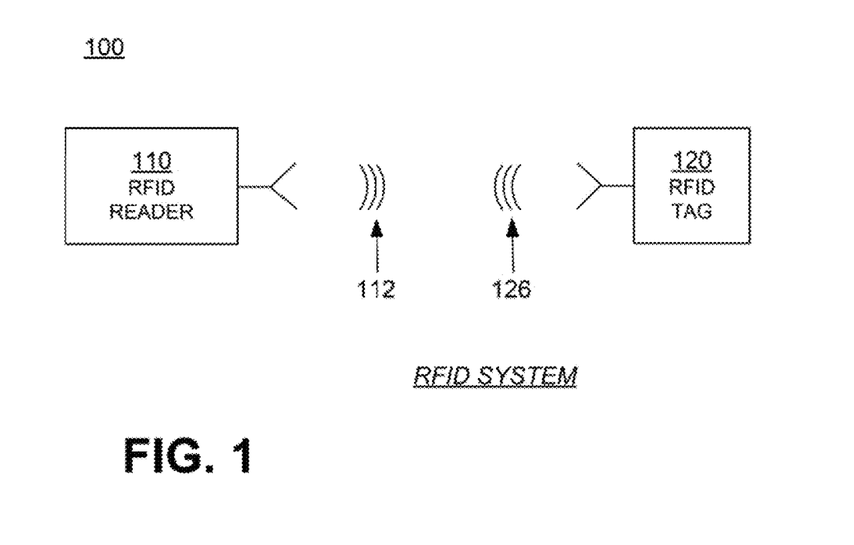
FIG. 1 is a block diagram of components of an RFID system.

FIG. 1 is a diagram of the components of a typical RFID system 100, incorporating embodiments. An RFID reader 110 transmits an interrogating RF signal 112. RFID tag 120 in the vicinity of RFID reader 110 senses interrogating RF signal 112 and generate signal 126 in response. RFID reader 110 senses and interprets signal 126. The signals 112 and 126 may include RF waves and/or non-propagating RF signals (e.g., reactive near-field signals)

Reader 110 and tag 120 communicate via signals 112 and 126. When communicating, each encodes, modulates, and transmits data to the other, and each receives, demodulates, and decodes data from the other. The data can be modulated onto, and demodulated from, RF waveforms. The RF waveforms are typically in a suitable range of frequencies, such as those near 900 MHz, 13.56 MHz, and so on.

The communication between reader and tag uses symbols, also called RFID symbols. A symbol can be a delimiter, a calibration value, and so on. Symbols can be implemented for exchanging binary data, such as "0" and "1", if that is desired. When symbols are processed by reader 110 and tag 120 they can be treated as values, numbers, and so on.

Tag 120 can be a passive tag, or an active or battery-assisted tag (i.e., a tag having its own power source). When tag 120 is a passive tag, it is powered from signal 112.

Figure 2:
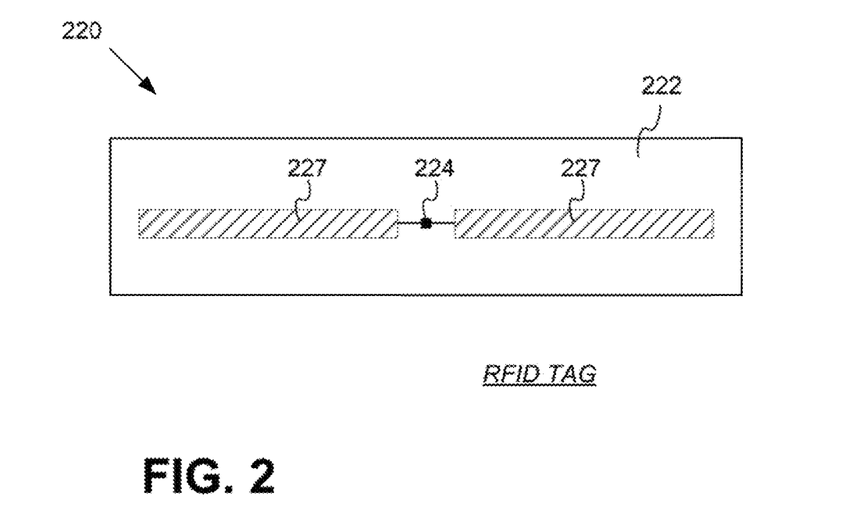
FIG. 2 is a diagram showing components of a passive RFID tag, such as a tag that can be used in the system of FIG. 1.

FIG. 2 is a diagram of an RFID tag 220, which may function as tag 120 of FIG. 1. Tag 220 is drawn as a passive tag, meaning it does not have its own power source. Much of what is described in this document, however, applies also to active and battery-assisted tags.

Tag 220 is typically (although not necessarily) formed on a substantially planar inlay 222, which can be made in many ways known in the art. Tag 220 includes a circuit which may be implemented as an IC 224. In some embodiments IC 224 is implemented in complementary metal-oxide semiconductor (CMOS) technology. In other embodiments IC 224 may be implemented in other technologies such as bipolar junction transistor (BJT) technology, metal-semiconductor field-effect transistor (MESFET) technology, and others as will be well known to those skilled in the art. IC 224 is arranged on inlay 222.

Tag 220 also includes an antenna for exchanging wireless signals with its environment. The antenna is often flat and attached to inlay 222. IC 224 is electrically coupled to the antenna via suitable antenna contacts (not shown in FIG. 2). The term "electrically coupled" as used herein may mean a direct electrical connection, or it may mean a connection that includes one or more intervening circuit blocks, elements, or devices. The "electrical" part of the term "electrically coupled" as used in this document shall mean a coupling that is one or more of ohmic/galvanic, capacitive, and/or inductive.

IC 224 is shown with a single antenna port, comprising two antenna contacts electrically coupled to two antenna segments 227 which are shown here forming a dipole. Many other embodiments are possible using any number of ports, contacts, antennas, and/or antenna segments.

In operation, the antenna receives a signal and communicates it to IC 224, which both harvests power and responds if appropriate, based on the incoming signal and the IC's internal state. If IC 224 uses backscatter modulation then it responds by modulating the antenna's reflectance, which generates response signal 126 from signal 112 transmitted by the reader. Electrically coupling and uncoupling the antenna contacts of IC 224 can modulate the antenna's reflectance, as can varying the admittance of a shunt-connected circuit element which is coupled to the antenna contacts. Varying the impedance of a series-connected circuit element is another means of modulating the antenna's reflectance.

In the embodiment of FIG. 2, antenna segments 227 are separate from IC 224. In other embodiments the antenna segments may alternatively be formed on IC 224. Tag antennas according to embodiments may be designed in any form and are not limited to dipoles. For example, the tag antenna may be a patch, a slot, a loop, a coil, a horn, a spiral, or any other suitable antenna.

The components of the RFID system of FIG. 1 may communicate with each other in any number of modes. One such mode is called full duplex. Another such mode is called half-duplex, and is described below.

Figure 3:
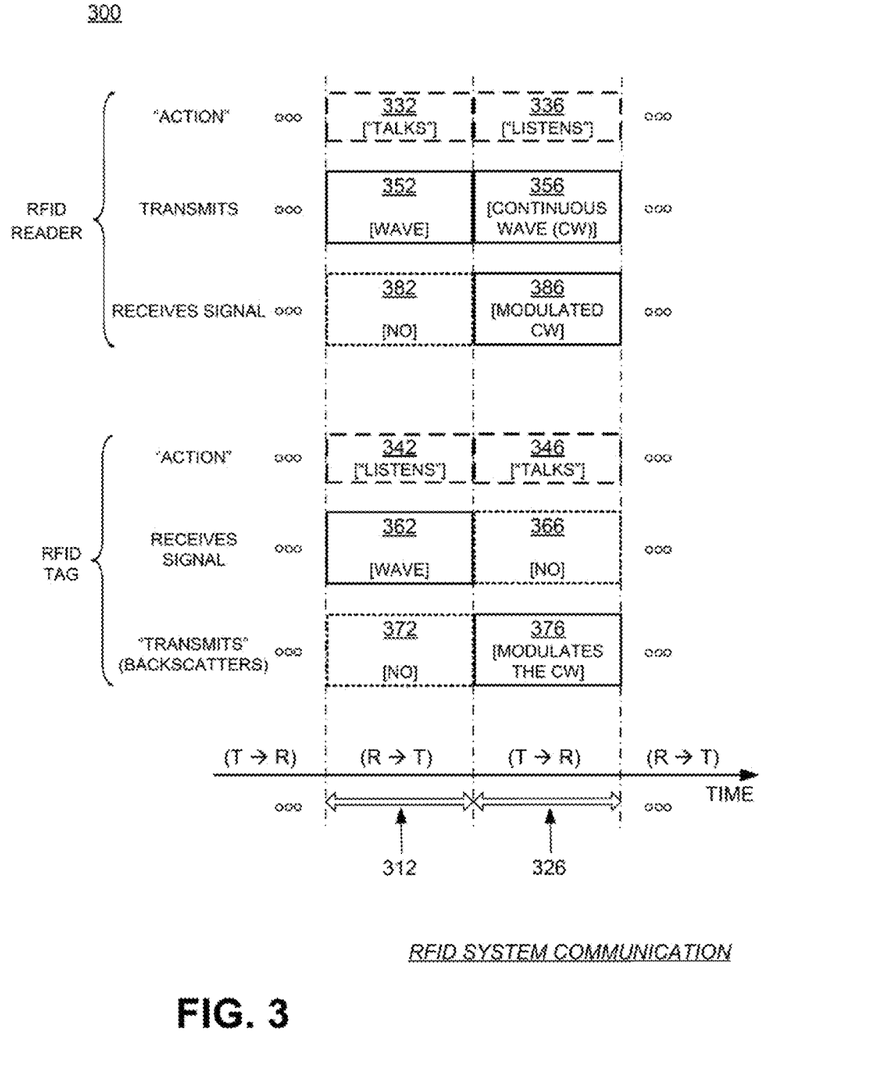
FIG. 3 is a conceptual diagram for explaining a half-duplex mode of communication between the components of the RFID system of FIG. 1.

FIG. 3 is a conceptual diagram 300 for explaining half-duplex communications between the components of the RFID system of FIG. 1, in this case with tag 120 implemented as passive tag 220 of FIG. 2. The explanation is made with reference to a TIME axis, and also to a human metaphor of "talking" and "listening". The actual technical implementations for "talking" and "listening" are now described.

RFID reader 110 and RFID tag 120 talk and listen to each other by taking turns. As seen on axis TIME, when reader 110 talks to tag 120 the communication session is designated as "R→T", and when tag 120 talks to reader 110 the communication session is designated as "T→R". Along the TIME axis, a sample R→T communication session occurs during a time interval 312, and a following sample T→R communication session occurs during a time interval 326. Of course interval 312 is typically of a different duration than interval 326—here the durations are shown approximately equal only for purposes of illustration.

According to blocks 332 and 336, RFID reader 110 talks during interval 312, and listens during interval 326. According to blocks 342 and 346, RFID tag 120 listens while reader 110 talks (during interval 312), and talks while reader 110 listens (during interval 326).

In terms of actual behavior, during interval 312 reader 110 talks to tag 120 as follows. According to block 352, reader 110 transmits signal 112, which was first described in FIG. 1. At the same time, according to block 362, tag 120 receives signal 112 and processes it to extract data and so on. Meanwhile, according to block 372, tag 120 does not backscatter with its antenna, and according to block 382, reader 110 has no signal to receive from tag 120.

During interval 326, tag 120 talks to reader 110 as follows. According to block 356, reader 110 transmits a Continuous Wave (CW) signal, which can be thought of as a carrier that typically encodes no information. This CW signal serves both to transfer energy to tag 120 for its own internal power needs, and also as a carrier that tag 120 can modulate with its backscatter. Indeed, during interval 326, according to block 366, tag 120 does not receive a signal for processing. Instead, according to block 376, tag 120 modulates the CW emitted according to block 356 so as to generate backscatter signal 126. Concurrently, according to block 386, reader 110 receives backscatter signal 126 and processes it.

Figure 4:
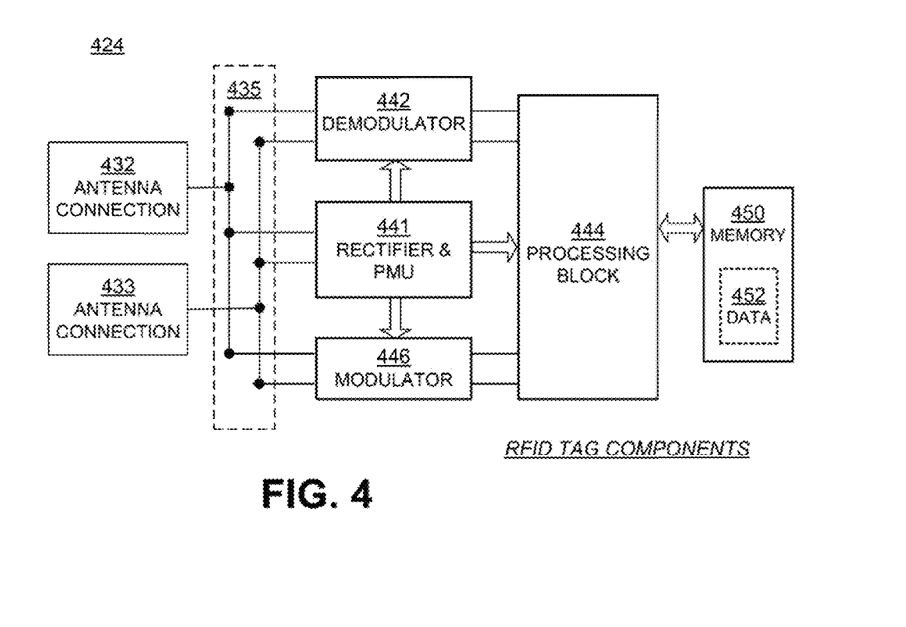
FIG. 4 is a block diagram showing a detail of an RFID tag, such as the one shown in FIG. 1.

FIG. 4 is a block diagram showing a detail of an RFID IC, such as IC 224 in FIG. 2. Electrical circuit 424 in FIG. 4 may be formed in an IC of an RFID tag, such as tag 220 of FIG. 2. Circuit 424 has a number of main components that are described in this document. Circuit 424 may have a number of additional components from what is shown and described, or different components, depending on the exact implementation.

Circuit 424 shows two antenna contacts 432, 433, suitable for coupling to antenna segments such as segments 227 of RFID tag 220 of FIG. 2. When two antenna contacts form the signal input from and signal return to an antenna they are often referred-to as an antenna port. Antenna contacts 432, 433 may be made in any suitable way, such as from metallic pads and so on. In some embodiments circuit 424 uses more than two antenna contacts, especially when tag 220 has more than one antenna port and/or more than one antenna.

Circuit 424 also includes signal-routing section 435 which may include signal wiring, a receive/transmit switch that can selectively route a signal, and so on.

Circuit 424 also includes a rectifier and PMU (Power Management Unit) 441 that harvests energy from the RF signal received by antenna 227 to power the circuits of IC 424 during either or both reader-to-tag (R→T) and tag-to-reader (T→R) sessions. Rectifier and PMU 441 may be implemented in any way known in the art.

Circuit 424 additionally includes a demodulator 442 that demodulates the RF signal received via antenna contacts 432, 433. Demodulator 442 may be implemented in any way known in the art, for example including a slicer, an amplifier, and so on.

Circuit 424 further includes a processing block 444 that receives the output from demodulator 442 and performs operations such as command decoding, memory interfacing, and so on. In addition, processing block 444 may generate an output signal for transmission. Processing block 444 may be implemented in any way known in the art, for example by combinations of one or more of a processor, memory, decoder, encoder, and so on.

Circuit 424 additionally includes a modulator 446 that modulates an output signal generated by processing block 444. The modulated signal is transmitted by driving antenna contacts 432, 433, and therefore driving the load presented by the coupled antenna segment or segments. Modulator 446 may be implemented in any way known in the art, for example including a switch, driver, amplifier, and so on.

In one embodiment, demodulator 442 and modulator 446 may be combined in a single transceiver circuit. In another embodiment modulator 446 may modulate a signal using backscatter. In another embodiment modulator 446 may include an active transmitter. In yet other embodiments demodulator 442 and modulator 446 may be part of processing block 444.

Circuit 424 additionally includes a memory 450 to store data 452. At least a portion of memory 450 is preferably implemented as a Nonvolatile Memory (NVM), which means that data 452 is retained even when circuit 424 does not have power, as is frequently the case for a passive RFID tag.

In some embodiments, particularly in those with more than one antenna port, circuit 424 may contain multiple demodulators, rectifiers, PMUs, modulators, processing blocks, and/or memories.

In terms of processing a signal, circuit 424 operates differently during a R→T session and a T→R session. The different operations are described below, in this case with circuit 424 representing an IC of an RFID tag.

Figure 5A:
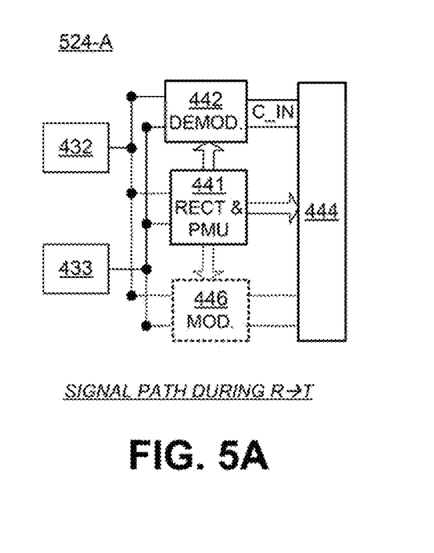
FIGS. 5A and 5B illustrate signal paths during tag-to-reader and reader-to-tag communications in the block diagram of FIG. 4.

FIG. 5A shows version 524-A of components of circuit 424 of FIG. 4, further modified to emphasize a signal operation during a R→T session during time interval 312 of FIG. 3. Demodulator 442 demodulates an RF signal received from antenna contacts 432, 433. The demodulated signal is provided to processing block 444 as C_IN. In one embodiment, C_IN may include a received stream of symbols.

Version 524-A shows as relatively obscured those components that do not play a part in processing a signal during a R→T session. Rectifier and PMU 441 may be active, such as for converting RF power. Modulator 446 generally does not transmit during a R→T session, and typically does not interact with the received RF signal significantly, either because switching action in section 435 of FIG. 4 decouples modulator 446 from the RF signal, or by designing modulator 446 to have a suitable impedance, and so on.

Although modulator 446 is typically inactive during a R→T session, it need not be so. For example, during a R→T session modulator 446 could be adjusting its own parameters for operation in a future session, and so on.

Figure 5B:
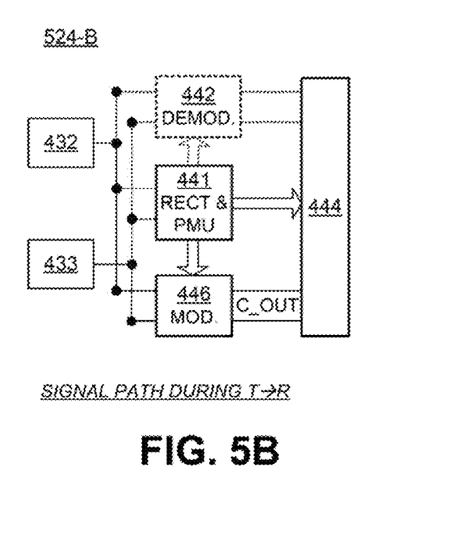

FIG. 5B shows version 524-B of components of circuit 424 of FIG. 4, further modified to emphasize a signal operation during a T→R session during time interval 326 of FIG. 3. Processing block 444 outputs a signal C_OUT. In one embodiment, C_OUT may include a stream of symbols for transmission. Modulator 446 then modulates C_OUT and provides it to antenna segments such as segments 227 of RFID tag 220 via antenna contacts 432, 433.

Version 524-B shows as relatively obscured those components that do not play a part in processing a signal during a T→R session. Rectifier and PMU 441 may be active, such as for converting RF power. Demodulator 442 generally does not receive during a T→R session, and typically does not interact with the transmitted RF signal significantly, either because switching action in section 435 of FIG. 4 decouples demodulator 442 from the RF signal, or by designing demodulator 442 to have a suitable impedance, and so on.

Although demodulator 442 is typically inactive during a T→R session, it need not be so. For example, during a T→R session demodulator 442 could be adjusting its own parameters for operation in a future session, and so on.

In typical embodiments, demodulator 442 and modulator 446 are operable to demodulate and modulate signals according to a protocol, such as the Gen2 Specification referenced above. In embodiments where circuit 424 includes multiple demodulators and/or modulators, each may be configured to support different protocols or different sets of protocols. A protocol specifies, in part, symbol encodings, and may include a set of modulations, rates, timings, or any other parameter associated with data communications.

Figure 6:
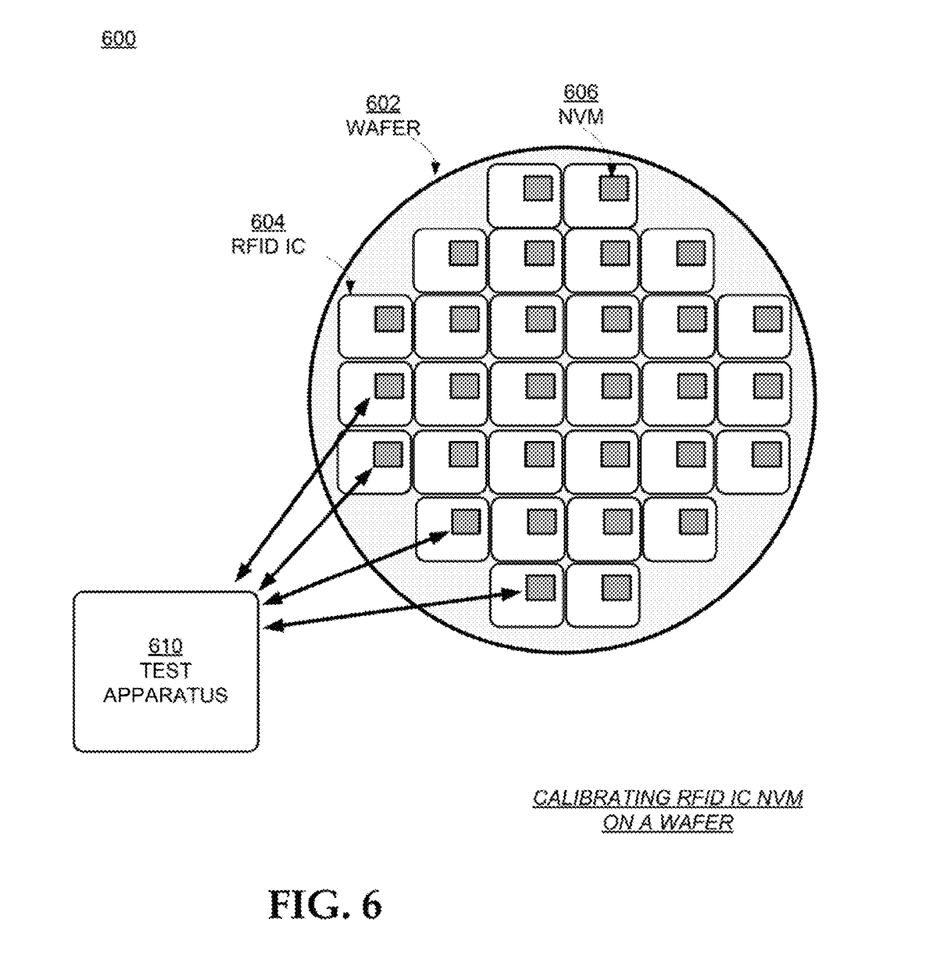
FIG. 6 is a conceptual diagram illustrating a test apparatus calibrating RFID IC NVM while the IC is still part of a semiconductor wafer.

FIG. 6 is a conceptual diagram illustrating a test apparatus calibrating an RFID tag IC NVM while the IC is still on a wafer.

In a typical RFID tag IC manufacturing process, RFID ICs (e.g. RFID IC 604) are manufactured as part of a wafer 602. Each RFID IC 604 includes a memory such as NVM 606. As described above, an NVM includes one or more memory cells, whose contents may be changed by a write operation. NVM may be one-time-programmable (i.e., can be only written once) or many-time-programmable (i.e., can be written to repeatedly). As a consequence of manufacturing variations, each NVM may require a different tunneling voltage to write its memory cells. Test apparatus 610 performs a series of measurements during die- or wafer-level testing to determine the tunneling voltage and then configures (calibrates) each NVM 606 to follow a tailored tunneling-ramp profile. By measuring each IC the wafer-to-wafer or lot-to-lot or even IC-to-IC oxide-thickness variations (as well as other parameters that influence tunneling) may be taken into account in the ramp profile.

The measurements provide information for defining the ramp profile, which may be stored in a digital format (i.e. using bits) or in an analog format (i.e. as voltage or current) in IC memory. Among the stored parameters is the tunneling voltage that an IC charge pump should generate before checking the NVM data as well as a ramp rate for achieving the tunneling voltage. RFID IC 604 may read the stored ramp profile during tag initialization, just before writing the NVM, when told to do so by an RFID reader, or at other times as may be determined by the tag. Then when the IC writes to the NVM it can use the stored ramp profile. In some embodiments, as described below, the IC may further modify the stored ramp profile based on IC operating conditions at the time of write. The IC may then use the modified ramp profile to actually write to the NVM.

Figure 7:
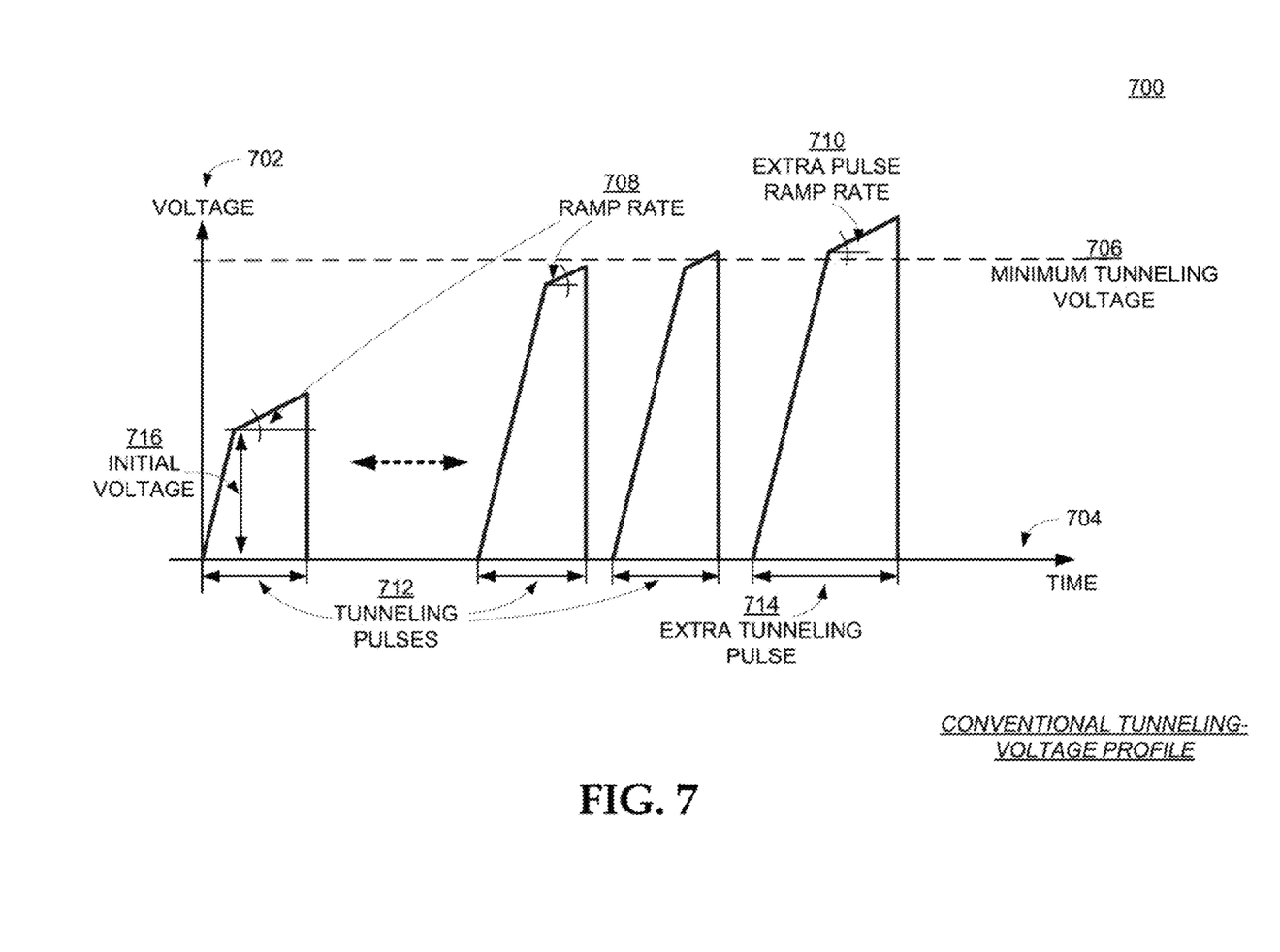
FIG. 7 illustrates a conventional tunneling-voltage profile.

FIG. 7 illustrates a conventional tunneling-voltage profile.

As shown in the voltage (702) vs. time (704) graph 700 of FIG. 7, the conventional tunneling-voltage profiles comprise a series of successive tunneling pulses 712 with interspersed data checks to determine if a memory cell is written adequately. The first tunneling pulse starts at a low voltage 716, and each successive pulse increases the tunneling voltage. Each pulse typically rises quickly to the voltage level of the prior pulse, then gradually ramps the tunneling voltage at the ramp rate 708 during the pulse duration. The voltage at which the data check indicates a successful memory write is denoted the "minimum tunneling voltage". In some implementations, after the data check indicates a successful write, the charge pump issues a last "extra" pulse 714 to ensure a strong write. Note that this process requires multiple pulses and a long time duration to achieve the minimum tunneling voltage, because the charge pump does not have a priori knowledge of the minimum tunneling voltage and starts at a low initial voltage. Clearly, the charge pump can accelerate the process by starting at a high initial voltage, but a high initial voltage may be too high for some memory cells and could damage the oxide. Indeed, the variation in minimum tunneling voltage across NVMs can be so great that a voltage that is inadequate to write one NVM can permanently damage the oxide of another. Consequently, the charge pump must start at the lowest "safe" initial voltage and ramp from there, taking time and causing oxide stress with each pulse.

Figure 8:
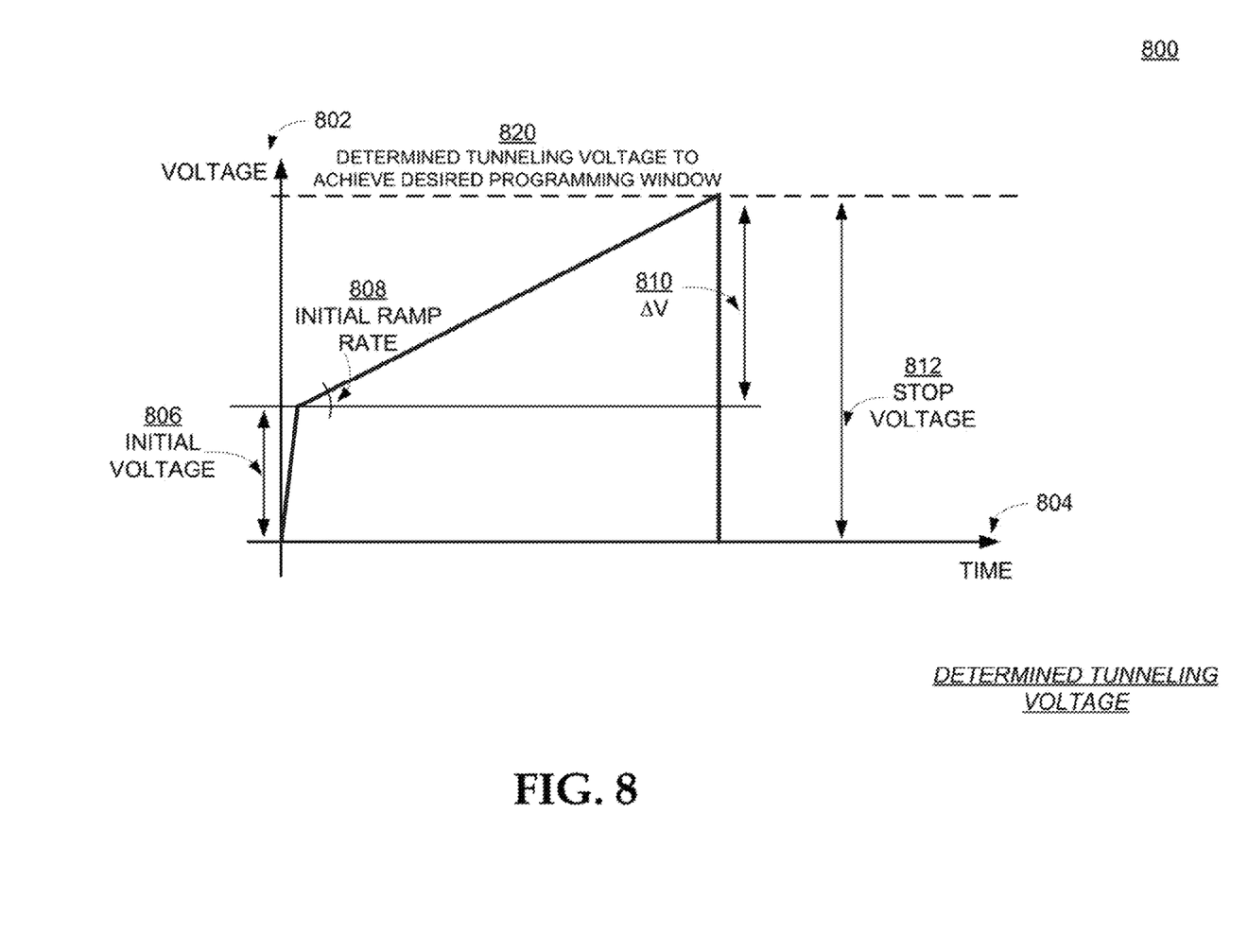
FIG. 8 illustrates a determined tunneling voltage for writing a tag IC NVM.

FIG. 8 illustrates a determined tunneling voltage for programming an NVM.

If a charge pump knows or has access to knowledge about the voltage needed to write data to the NVM, then it may ramp the tunneling voltage rapidly and without pulsing or other interruption to the determined tunneling voltage 820 that achieves the desired programming window, where a programming window is the magnitude of the difference (e.g. voltage) between one state of a memory cell of the NVM and the other state. This rapid ramp is a time-efficient way to program the NVM while at the same time preventing over-tunneling. However, to achieve this profile the charge pump must know or have access to the required tunneling voltage.

Diagram 800 shows an ideal tunneling ramp on a voltage (802) vs. time (804) graph. The tunneling voltage begins with initial voltage 806 and increases at an initial ramp rate 808 until it reaches stop voltage 812, which achieves optimum tunneling and the desired programming window. The voltage difference between initial voltage 806 and stop voltage 812 is ΔV 810.

In an RFID IC according to embodiments, the initial voltage 806, initial ramp rate 808, and stop voltage 812 may be determined using calibration measurements performed during die- or wafer-level testing. This ramp-profile information may be stored in IC memory, or provided to the tag by a reader at the time of NVM writing. The RFID IC may read the stored information during tag initialization, prior to NVM writing, or at another time as determined by the tag or reader, and may use the stored or provided information when writing to memory. Of course, in some embodiments the memory may still check the value after writing, even when using the determined tunneling voltage, to ensure that the stored value is correct. If necessary the charge pump can issue another pulse to further write the NVM, and may even choose to update the stored profile to change one or more of the initial voltage 806, initial ramp rate 808, or stop voltage 812.

Figure 9:
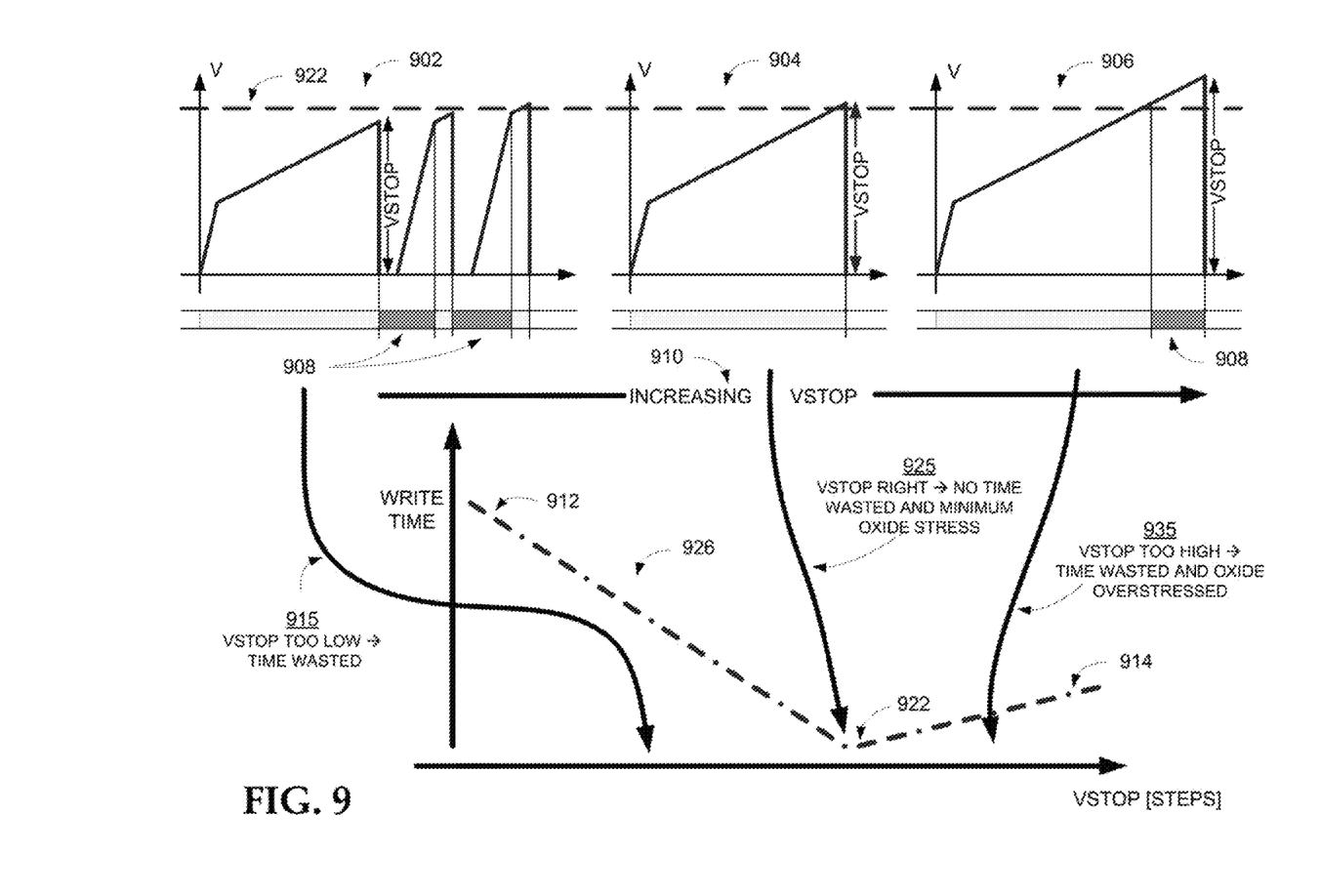
FIG. 9 illustrates how write time and oxide stress may be reduced by employing a tunneling-voltage profile according to embodiments.

FIG. 9 illustrates how write time and oxide stress may be reduced by using tunneling-voltage profile calibration according to embodiments.

The goal of the calibration measurements is to find a tunneling-voltage profile that allows writing data into the NVM within the desired time window but without overstressing the NVM oxide. Diagrams 902, 904, and 906 in FIG. 9 illustrate three different tunneling-ramp scenarios.

Diagram 902 is an example of a stop voltage that is too low, where the initial pulse fails to reach the optimum tunneling voltage. In this case the charge pump must generate additional tunneling pulses with increasing stop voltage (915), wasting time 908. By contrast, diagram 906 is an example of a stop voltage that is too high, wasting time 908 because the tunneling voltage ramps past the optimum, as well as overstressing the oxide due to the high voltage. Diagram 904 illustrates the optimum scenario, where the stop voltage is the optimum tunneling voltage required to write data without wasted time and without overstressing the oxide.

As shown in diagram 926, by choosing the stop voltage to be the optimum tunneling voltage, both the write time and oxide stress are minimized (point 922 on diagram 926). If the stop voltage is less than the optimum tunneling voltage 922 then the write time increases (point 912 on diagram 926). If the stop voltage is greater than the optimum tunneling voltage 922 then the write time increases and the oxide is overstressed (point 914 on diagram 926).

Figure 10:
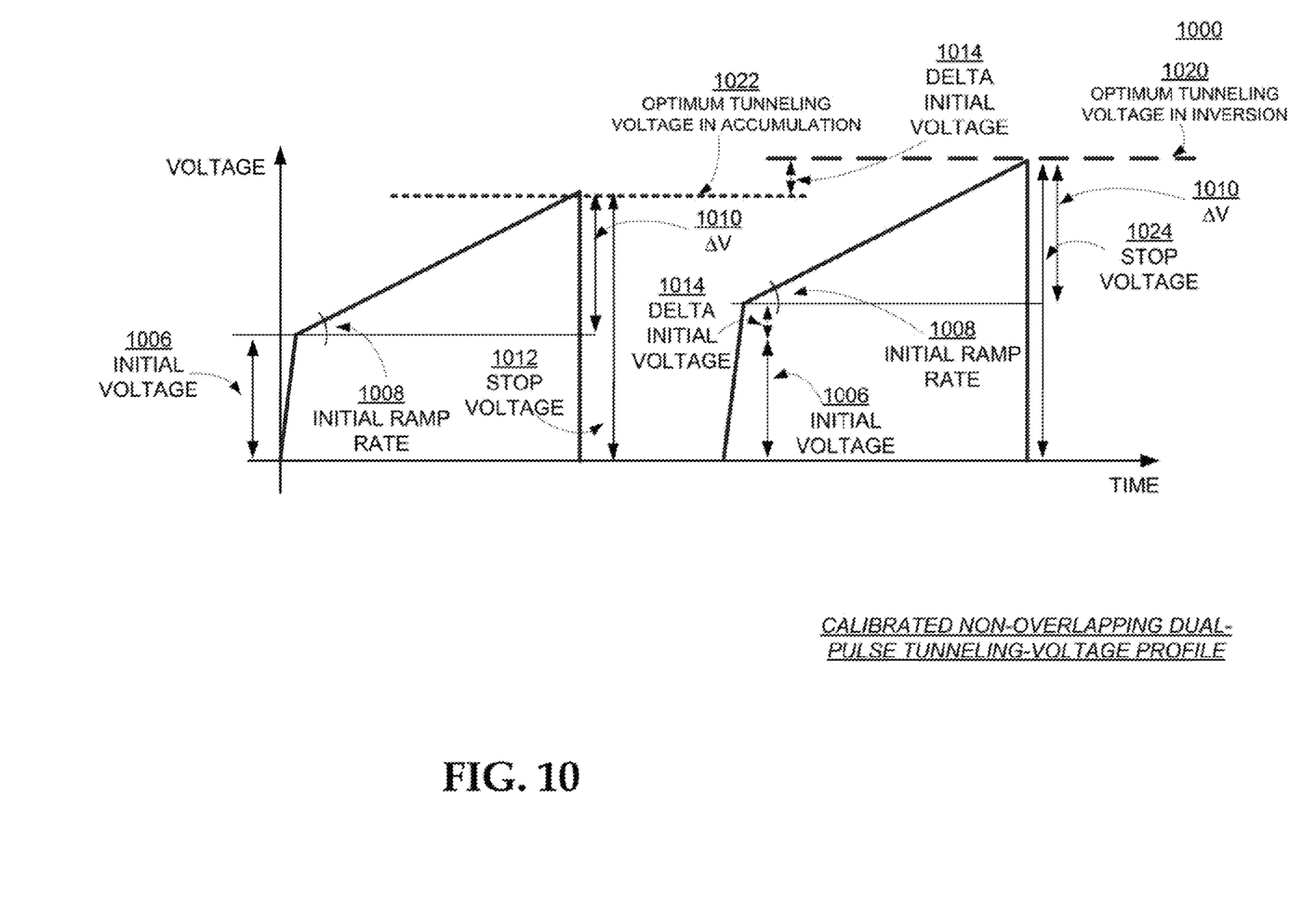
FIG. 10 illustrates an example calibrated, dual-pulse non-overlapping tunneling-voltage profile according to embodiments.

FIG. 10 illustrates an example of a calibrated, non-overlapping dual-pulse tunneling-voltage profile according to embodiments.

Some NVMs tunnel using two pulses, one accumulating and one inverting the doped semiconductor (typically silicon) that tunnels electrons across the floating-gate oxide. One reason to use both accumulation and inversion is to equalize the oxide stress. In most cases the optimum tunneling voltage is different for silicon in inversion and for silicon in accumulation. Regardless, the calibration principle is the same, although in a dual-pulse system the calibration parameters for each of the two pulses are stored in IC NVM rather than the parameters for a single pulse as described previously. Alternatively, it is possible to store parameters for one of the two pulses and then store the difference for the other of the two pulses. Regardless of the storage method, the IC uses the stored parameters to recreate the two pulses during tunneling.

Diagram 1000 illustrates two pulses in an IC employing accumulation and inversion tunneling according to embodiments. As discussed previously, to minimize both the write time and the oxide stress, the pulse for the accumulation phase needs to reach the optimum tunneling voltage in accumulation 1022, and the pulse for the inversion phase needs to reach the optimum tunneling voltage in inversion 1020.

The accumulation pulse starts with an initial voltage 1006 and increases using an initial ramp rate 1008 until reaching stop voltage 1012 with a difference ΔV 1010 between the initial and stop voltages. The inversion pulse starts with an initial voltage comprising initial voltage 1006 plus delta initial voltage 1014. In this example both pulses use the same ramp rate 1008, although the ramp rates need not be the same. Also in this example, difference ΔV 1010 is the same, although again, they need not be the same. Because the starting voltage for the inversion pulse was higher by delta initial voltage 1014, the stop voltage 1024 for the inversion pulse is likewise higher by delta initial voltage 1014.

The initial voltages, ramp rates, and stop voltages of both pulses may be stored in IC NVM during tag manufacture for subsequent use. Alternatively, one or more of the initial voltage, ramp rate, and stop voltage may be stored as delta values as in the example of FIG. 10.

Embodiments also include methods. Some are methods of manufacturing an RFID IC. Others are methods for controlling the manufacturing of an RFID IC. Others are methods for calibrating an RFID IC or writing to the NVM of an RFID IC. These methods can be implemented in any number of ways, including using the structures described in this document. One such way is by machine operations, of devices of the type described in this document. Another way is for one or more of the individual operations to be performed by one or more human operators. These human operators need not be collocated with each other, but each can be with a machine that performs a portion of a program or operation.

Figure 11:
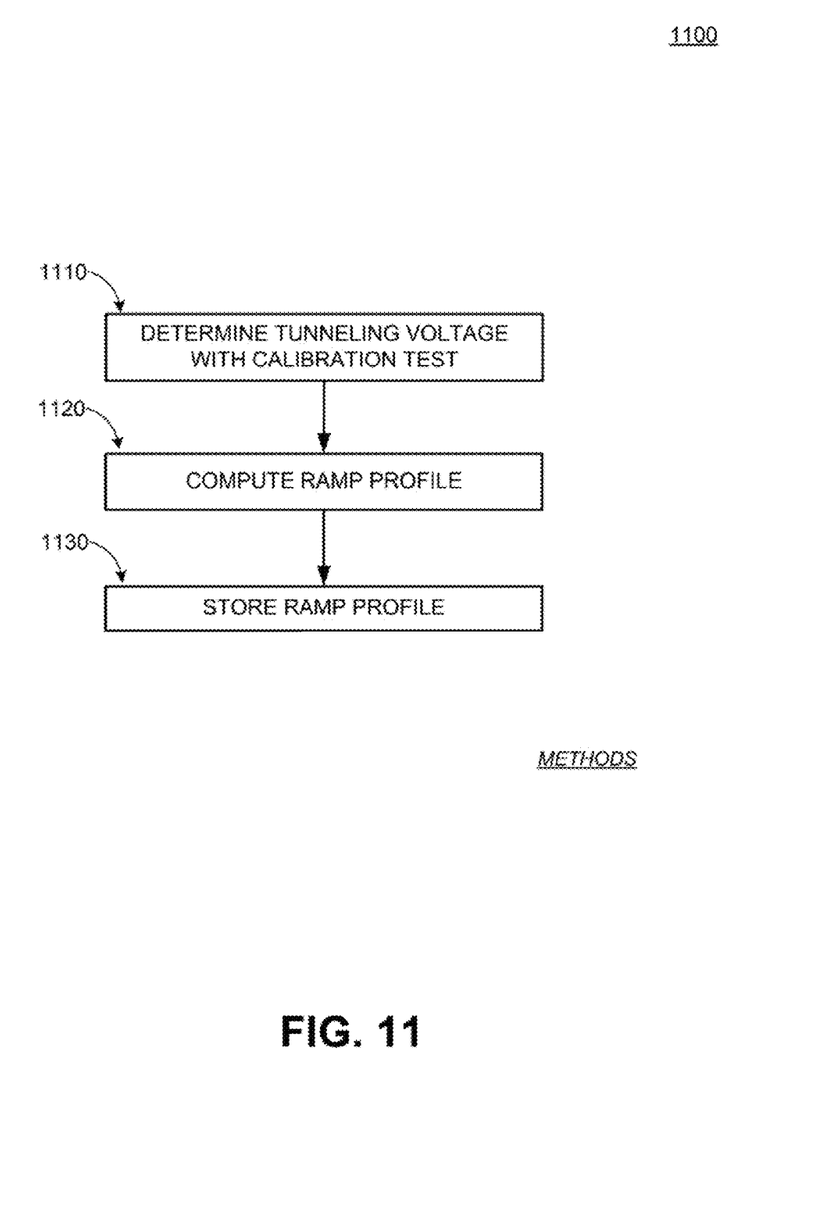
FIG. 11 is a flowchart illustrating a process of an RFID tag IC tunneling-voltage profile calibration according to embodiments.

FIG. 11 is a flowchart illustrating a process of RFID tag IC tunneling-voltage profile calibration according to embodiments.

Process 1100 begins at operation 1110, where a tunneling voltage is determined during calibration. At operation 1120, a ramp profile is computed based on the determined tunneling voltage and at least one of the initial voltage, ramp rate, stop voltage, delta initial voltage, and/or other parameters such as historic process information. At operation 1130, the ramp profile is stored in tag IC NVM such that the IC charge pump can be configured to use the stored parameters during actual tag writing operations. Optionally, an NVM write operation may be performed during the calibration, either before or after storing the ramp profile, to verify the stored ramp profile.

In some embodiments, an IC's current operating conditions may affect its NVM write process. If so, the IC may modify the predetermined ramp profile to write the NVM. For example, under some operating conditions it may be desirable to reduce IC power consumption. To accomplish this, the IC may modify a predetermined ramp profile by, for example, increasing the time for a tunneling pulse. By increasing the time allotted for a tunneling pulse, the voltage ramp rate can be lowered, thereby decreasing the amount of current needed to drive the voltage change and reducing the overall power consumed. On the other hand, in some situations it may be desirable to increase the IC NVM write speed, and the IC may decrease the time for the tunneling pulse, thereby increasing power consumption. In some embodiments, the IC may also (or instead) adjust the initial or stop voltage and/or the ramp rate, or even add or remote pulses from the predetermined ramp profile.

Figure 12:
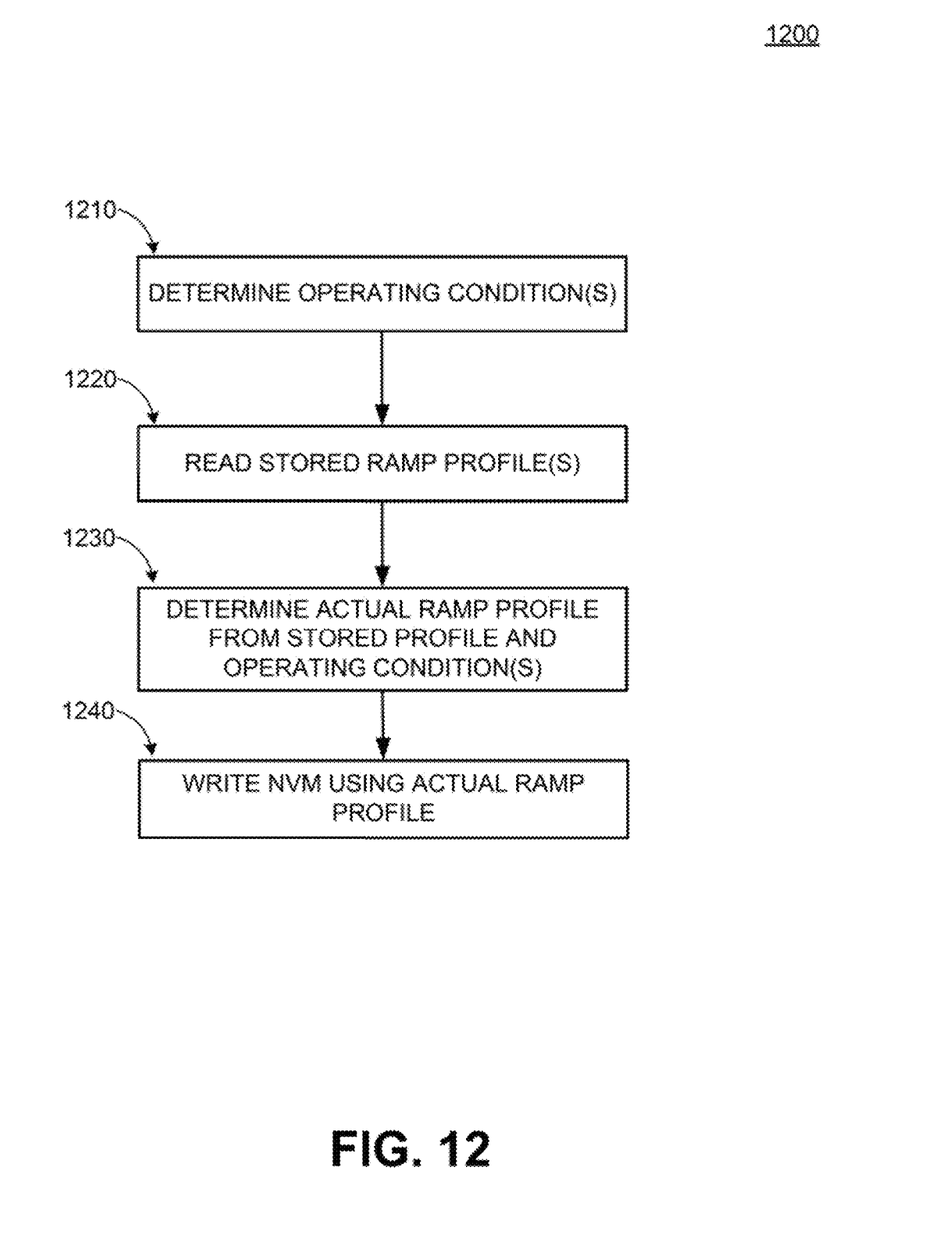
FIG. 12 is a flowchart depicting an IC NVM writing process according to embodiments.

FIG. 12 is a flowchart depicting an IC NVM writing process 1200 according to embodiments. In step 1210, an IC that intends to write its NVM may determine one or more operating conditions that may affect the NVM write process. For example, as mentioned above, desired power consumption may affect the NVM write process. Other factors may include IC characteristics, external characteristics, and/or received data. IC characteristics may be related to the internal operation of the IC. One IC characteristic is the IC's current operating mode. If the IC is in a calibration mode, it may be able to use higher power to perform NVM writes than if it were in another operating mode. Similarly, if the IC is in an operating mode that emphasizes throughput (e.g., a mode that maximizes the data written or number of ICs processed per unit of time), the IC may perform NVM writes with higher power. In some embodiments, the IC may be in an operating mode intended to reduce power differences between memory read operations (which take relatively less power) and memory write operations (which take relatively more power), and may therefore consume less power when performing NVM writes. Another IC characteristic similar to operating modes may be protocol state. As with different operating mode, an IC in a particular protocol state (e.g., one of the Gen2 states "ready", "open", "secured", etc. described in the Gen2 Specification) may perform NVM writes with higher power and/or shorter write time than if it were in a different protocol state.

In some embodiments, the IC may modify its NVM write process based on operating frequency (e.g., the frequency of received or transmitted signals). For example, the IC may use a higher voltage, power, and/or longer write time at a particular frequency than at another frequency. The IC may also modify its NVM write process based on the number of memory/NVM writes it has already performed. For example, as the number of NVM writes increases the IC may decrease the power/voltage used in an NVM write or increase the write time to reduce stress on the memory due to prior writes, or vice-versa.

External characteristics may also affect the NVM write process. In some embodiments, an IC may modify its NVM write process based on its location. For example, if the IC detects that it is in a test or calibration environment, it may perform NVM writes with relatively higher voltage/power and/or lower time duration. On the other hand, if the IC detects that it is in an environment with a lot of other ICs, it may perform NVM writes with relatively lower voltage/power and/or lower time duration due to potentially lower received power. Characteristics of a tag and/or item associated with the IC, as well as environmental characteristics such as temperature or noise, may also cause the IC to modify its NVM write process.

Received data may also affect the NVM write process. In some embodiments, the data rate of a received signal may affect how quickly (and with how much power) an IC writes its NVM. For example, a high-data-rate signal may cause the IC to write its NVM with a faster (and more powerful) ramp profile than a low-data-rate signal. Similarly, if the IC has a large amount of data to write it may use a faster/more powerful ramp profile to write its NVM than if it has a relatively small amount of data to write. In some embodiments, the IC may also modify its NVM write process based on the actual received data. For example, the IC may receive a command to adjust the power/voltage/speed of its NVM write process. The command may be standalone or embedded in another command (e.g., a write command).

In addition to the examples described above, an IC may modify its NVM write process and/or predetermined ramp profiles in response to any other suitable IC characteristic, external characteristic, received data, or any other suitable criteria.

After determining any operating conditions, in step 1220 the IC may read one or more stored ramp profiles (e.g., the ramp profiles computed and stored in process 1100). If only one stored ramp profile exists, the IC may read that stored ramp profile. If multiple stored ramp profiles exist, the IC may select the stored ramp profile that is most suitable, based on the operating conditions determined in step 1210.

In step 1230, the IC may then determine an actual ramp profile for writing the NVM based on the operating conditions determined in step 1210 and the stored ramp profile read in step 1220. For example, the IC may adjust the voltage, power, ramp rate, and/or ramp time of the read ramp profile based on the operating conditions. In some embodiments, the actual ramp profile may be determined based on some of the same criteria used to generate the stored, predetermined ramp profiles, such as by minimizing write time, minimizing memory cell stress, adding voltages based on programming windows, process characteristics, and so on. Finally, in step 1240 the IC may use the actual ramp profile to perform the NVM write. In some embodiments, the IC may also store the actual ramp profile, in place of or in addition to the read ramp profile.

The operations described in processes 1100 and 1200 are for illustration purposes only. NVM calibration and writing processes in an RFID IC may be implemented employing additional or fewer operations and in different orders using the principles described herein. Of course an order of the operations may be modified, some operations eliminated, or other operations added according to other embodiments. Also, while the RFID ICs are described above as RFID tag ICs, the NVM calibration/write processes described above are also applicable to ICs in RFID readers, such as RFID reader ICs configured to send commands to and receive responses from RFID tags or tag ICs.

The foregoing detailed description has set forth various embodiments of the devices and/or processes via the use of block diagrams and/or examples. Insofar as such block diagrams and/or examples contain one or more functions and/or aspects, it will be understood by those within the art that each function and/or aspect within such block diagrams or examples may be implemented, according to embodiments formed, individually and/or collectively, by a wide range of hardware, software, firmware, or virtually any combination thereof.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, configurations, memories, antennas, transmission lines, and the like, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). It will be further understood that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member.

We claim:

1. A method for writing a nonvolatile memory (NVM) of a Radio Frequency Identification (RFID) Integrated Circuit (IC) comprising:
   determining an operating condition of the IC;
   reading at least one predetermined ramp profile stored in a memory of the IC;
   determining an actual ramp profile based on the at least one predetermined ramp profile and the operating condition; and
   using the actual ramp profile to write the NVM.

2. The method of claim 1, wherein determining the actual ramp profile includes at least one of:
   generating the actual ramp profile by adjusting the predetermined ramp profile based on the operating condition; and
   selecting the actual ramp profile from a plurality of predetermined ramp profiles stored in the memory based on the operating condition.

3. The method of claim 1, wherein the operating condition includes at least one of:
   an operating frequency for the IC;
   an operating mode for the IC;
   a number of memory writes to the IC;
   an amount of data to be written to the IC;
   an operating power for the IC; and
   an environmental parameter associated with the IC.

4. The method of claim 1, further comprising:
   determining the actual ramp profile by minimizing at least one of a time needed to write the NVM and a stress on memory cells of the NVM.

5. The method of claim 1, wherein determining the actual ramp profile further comprises:
   adding a voltage to a predetermined voltage, wherein the added voltage is based on at least one of a programming window, a process characteristic, a write time requirement, and the operating condition.

6. The method of claim 1, wherein the predetermined ramp profile is based on at least one of:
   a determined tunneling voltage of at least one memory cell of the NVM;
   a determined tunneling voltage of at least one test circuit on a semiconductor wafer; and
   a determined tunneling voltage of at least one memory cell on the semiconductor wafer.

7. The method of claim 1, further comprising at least one of:
   updating the stored predetermined ramp profile based on the actual ramp profile; and
   updating the stored predetermined ramp profile if the NVM write does not complete in an expected amount of time.

8. The method of claim 1, further comprising:
   verifying the contents of at least one memory cell of the NVM after writing.

9. The method of claim 1, wherein the predetermined ramp profile is for at least one from a set of: the entire NVM, a row of the NVM, a set of memory cells in the NVM, and an individual memory cell in the NVM.

10. The method of claim 1, wherein the predetermined ramp profile contains at least one from a set of: a ramp voltage, a ramp rise time, a number of pulses, and a pulse duration.

11. An apparatus for calibrating a nonvolatile memory (NVM) of a Radio Frequency Identification (RFID) Integrated Circuit (IC), the apparatus configured to:
    determine a tunneling voltage for the NVM;
    compute at least one predetermined ramp profile for writing the NVM based on at least the determined tunneling voltage; and
    store the at least one predetermined ramp profile in a memory of the IC such that the IC is enabled to subsequently write a value to the NVM by:
    determining an operating condition of the IC;
    reading the at least one stored predetermined ramp profile;
    determining an actual ramp profile based on the at least one predetermined ramp profile and the operating condition; and
    using the actual ramp profile to write the NVM.

12. The apparatus of claim 11, wherein the tunneling voltage is determined by adjusting a ramp profile such that at least one of a time needed to write the NVM and a stress on memory cells of the NVM is minimized.

13. The apparatus of claim 11, wherein the IC is further enabled to determine the actual ramp profile by adding a voltage to the determined tunneling voltage, wherein the added voltage is based on at least one of a programming window, a process characteristic, a write time requirement, and a set of IC operating conditions.

14. The apparatus of claim 11, wherein the at least one predetermined ramp profile is computed based on a determined tunneling voltage of at least one of:
    a memory cell of the NVM;
    a test circuit on a semiconductor wafer; and
    a memory cell on the semiconductor wafer.

15. The apparatus of claim 11, wherein the at least one predetermined ramp profile is for at least one of the entire NVM, a row of the NVM, a set of memory cells in the NVM, and an individual memory cell in the NVM.

16. The apparatus of claim 11, wherein the apparatus is further configured to verify the contents of at least one memory cell of the NVM after writing.

17. The apparatus of claim 16, wherein if the verification fails the apparatus is further configured to:
    re-determine the tunneling voltage;
    update the at least one stored predetermined ramp profile; and
    use the updated ramp profile to write the NVM.

18. The apparatus of claim 11, wherein the stored ramp profile contains at least one from a set of: a ramp voltage, a ramp rise time, a number of pulses, and a pulse duration.

19. The apparatus of claim 11, wherein the apparatus is further configured to compute a plurality of predetermined ramp profiles, each corresponding to a distinct value of the operating condition.

20. A Radio Frequency Identification (RFID) Integrated Circuit (IC) comprising:
    a nonvolatile memory (NVM);
    at least one predetermined ramp profile stored in a memory of the RFID IC;
    wherein prior to writing to a memory cell of the NVM, the RFID IC:
    determines an operating condition of the RFID IC;
    reads the at least one stored predetermined ramp profile;

determines an actual ramp profile based on the at least one predetermined ramp profile and the operating condition, and uses the actual ramp profile to write to the memory cell of the NVM.

* * * * *

UNITED STATES PATENT AND TRADEMARK OFFICE
CERTIFICATE OF CORRECTION

| | | |
|---|---|---|
| PATENT NO. | : 8,902,627 B1 | Page 1 of 1 |
| APPLICATION NO. | : 13/872974 | |
| DATED | : December 2, 2014 | |
| INVENTOR(S) | : Pesavento et al. | |

It is certified that error appears in the above-identified patent and that said Letters Patent is hereby corrected as shown below:

In the Specification

In Column 3, Line 41, Delete "signals)" and insert -- signals). --, therefor.

Signed and Sealed this
Fifth Day of May, 2015

Michelle K. Lee
*Director of the United States Patent and Trademark Office*